United States Patent [19]

Garth et al.

[11] Patent Number: 4,927,741
[45] Date of Patent: May 22, 1990

[54] PROCESSING OF EXPOSED LITHOGRAPHIC PRINTING PLATES BY CONDUCTING SECOND EXPOSURE UNDER WATER

[75] Inventors: Peter Garth; Stuart M. Simpson, both of Leeds, United Kingdom; John E. Parkinson, Lincoln, Nebr.; Alan H. Rogers, Stockport, England

[73] Assignee: Horsell Graphic Industries Limited, Leeds, England

[21] Appl. No.: 274,730

[22] Filed: Nov. 14, 1988

Related U.S. Application Data

[63] Continuation of Ser. No. 25,414, Mar. 13, 1987, abandoned.

[30] Foreign Application Priority Data

Mar. 13, 1986 [GB] United Kingdom ............... 8606258

[51] Int. Cl.⁵ .................... G03C 5/24; G03F 7/08; G03F 7/26
[52] U.S. Cl. .................................... 430/309; 430/325; 430/328; 430/330
[58] Field of Search ............... 430/330, 328, 325, 302, 430/309

[56] References Cited

U.S. PATENT DOCUMENTS

| | | | |
|---|---|---|---|
| 3,264,104 | 8/1966 | Reichel | 96/33 |
| 3,723,120 | 3/1973 | Hummel | 96/35.1 |
| 4,148,934 | 4/1979 | Baker | 427/54 |
| 4,338,007 | 6/1982 | Fromson et al. | 430/328 |
| 4,361,642 | 11/1982 | Grossa | 430/309 |
| 4,415,654 | 11/1983 | Pohl | 430/328 |
| 4,576,901 | 3/1986 | Stahlhofen et al. | 430/330 |
| 4,581,321 | 4/1986 | Stahlhofen | 430/330 |

FOREIGN PATENT DOCUMENTS

| | | |
|---|---|---|
| 0103337 | 3/1984 | European Pat. Off. |
| 2648438 | 1/1978 | Fed. Rep. of Germany |
| 58-97043 | 9/1983 | Japan |
| 58-100128 | 9/1983 | Japan |
| 0542167 | 1/1977 | U.S.S.R. |
| 2171530A | 8/1986 | United Kingdom |

OTHER PUBLICATIONS

Chemical Abstracts, vol. 86, 1977, p. 665.
Chemical Abstracts, vol. 91, 1979, p. 674.
2244 Research Disclosure, Feb., 1986, No. 262, New York, p. 26214.

*Primary Examiner*—Paul R. Michl
*Assistant Examiner*—Patrick A. Doody
*Attorney, Agent, or Firm*—Klauber & Jackson

[57] ABSTRACT

The invention relates to an automatic machine for the reversal processing of lithographic printing plates which are required to be exposed overall after heating. The method and apparatus of the invention provide that the exposure be effected while the plates are being conveyed through water in a shallow bath.

5 Claims, 2 Drawing Sheets

PROCESSING OF EXPOSED LITHOGRAPHIC PRINTING PLATES BY CONDUCTING SECOND EXPOSURE UNDER WATER

This application is a continuation of application Ser. No. 025,414, filed 3/13/87 now abandoned.

The invention relates to the processing of exposed lithographic printing plates.

It is known that lithographic printing plates having certain light sensitive coatings, such as that photosoluble comprising an orthoquinone diazide described in our British Patent No. 2082339, may be reversed during processing whereby a negative of an original image may be produced on the plates by the successive steps of imagewise exposing the plates, heating them to convert the coating in the irradiated areas to a form insoluble in alkaline developer and then overall exposing the plates whereby the coating in the areas not previously irradiated are decomposed to a form soluble in such developer. The conversion on irradiation at least of the coating of the specific example is understood to be a degradative process resulting in the formation of carboxyl groups.

It is desireable from an economic standpoint that the reversal process be carried out at high speed and preferably by passing the plates through the steps of heating and overall exposing in an integrated processing machine, but whilst the thermal conversion of the coating on the imagewise exposed areas of the plates may readily be effected at high speed, difficulty has been experienced in completing the reversal process at the same speed of throughput.

It appears that it is advantageous to cool the plates between the heating and overall exposure steps, but the provision of a cooling stage is found not to be sufficient to ensure an entirely satisfactory result from the irradiation stage, and it is an object of the present invention therefore to provide further improvement in the irradiation stage.

According to one aspect of the present invention there is provided a method for the reversal processing of lithographic printing plates having a light sensitive coating at one surface comprising the successive steps of:

(i) imagewise exposing the coated surface to render it soluble in developer;

(ii) heating the plate to render the imagewise exposed portion relatively insoluble in the developer;

(iii) providing at the coating surface an immediate environment having a water content greater than that of the surrounding atmosphere; and (iv) irradiating said surface overall. Preferably the irradiation is effected through said environment.

The method may comprise the further step of cooling the plate after the heating thereof.

The water content of the immediate environment may be purely gaseous. Preferably, however, the environment comprises liquid water. The water may be in a continuous layer.

The light-sensitive coating may comprise an aromatic quinone diazide and may further comprise a resol or novolak resin.

The irradiation may be effected by a UV lamp.

According to a further aspect of the invention there is provided apparatus for use in the reversal processing of a photosoluble lithographic printing plate having a light sensitive coating on a surface thereof which coating has been imagewise exposed to actinic radiation, the apparatus comprising:

(i) means for heating the exposed surface;

(ii) means for providing for the said surface an immediate environment having a water content greater than that of the surrounding atmosphere; and (iii) means for overall exposure of said surface to actinic radiation.

Preferably the apparatus is such that irradiation is effected through the said environment.

The apparatus may comprise means for further cooling the plate between means (i) and (ii).

The apparatus may further comprise conveying means for conveying said plate successively in effective positional relationship with said means (i) to (iii) and, where employed, said cooling means. The conveying means may comprise spaced chains.

The means for providing an immediate environment of high water content may comprise a water bath. The apparatus may further comprise nip rollers for introducing the plates into the water bath, and further nip rollers may be provided to pull the plate out of the bath.

Embodiments of the invention will now be described by way of example and with reference to the accompanying schematic drawings of which:

Figure 1:
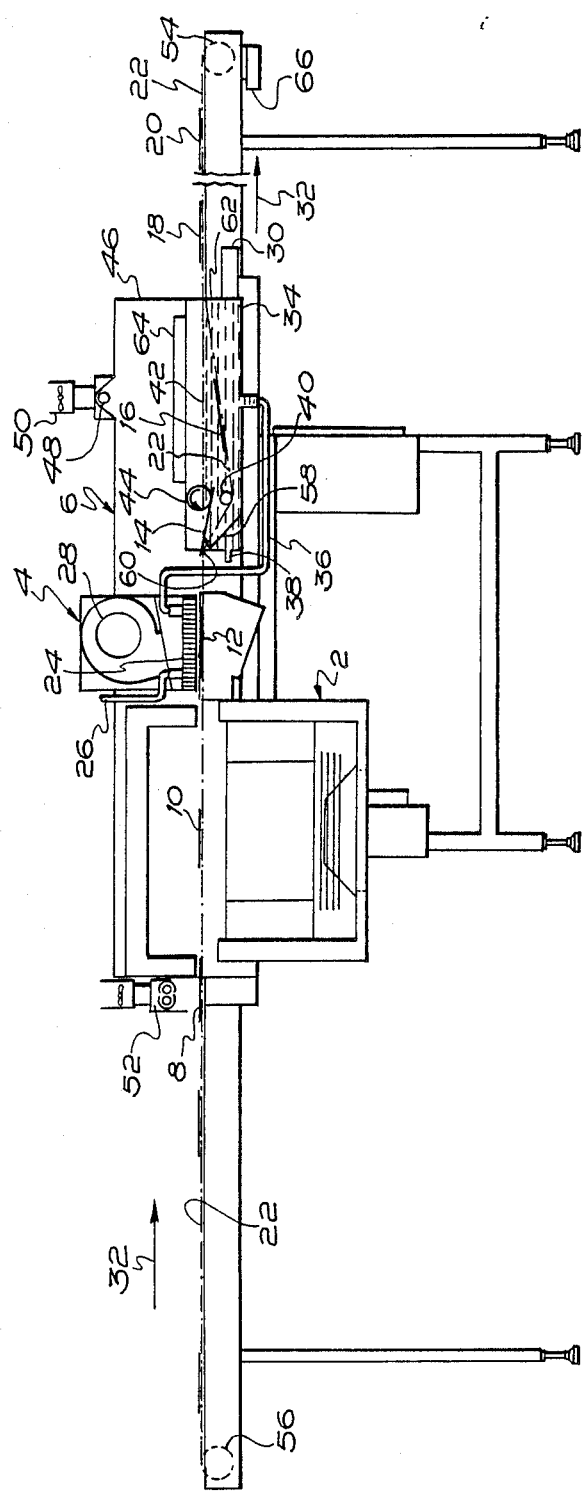
FIG. 1 shows an embodiment of a plate processing machine in longitudinal section.

As shown in FIG. 1, the lithographic processing unit comprises an oven 2, a cooling unit 4 and an irradiating unit 6 through each of which plates 8-20 are passed continuously, with their sensitised surfaces uppermost and supported in conventional fashion on a plurality of endless chains 22 spaced laterally of the units so as to support the plates across their full width. The chains are pulled through the processing unit in the direction of arrow 32 by sprocket 54 at a speed in the range 1 m/min or faster and restrained by flanged pulleys 56 so that the upper, plate-supporting reach is taut and the lower, return, reach (not shown) is slack.

Plate 8 is shown entering the oven 2 and plate 10 is shown within the oven which, is set at a temperature to heat the plates to between, say, 120°-140° C. At high throughput speeds, the conventional oven may not provide enough power to raise the temperature of the plates as required during the time the plates remain therein, and it may be necessary to augment the heating step with an infra-red pre-heater 52.

It is believed that heated plates need to be cooled to improve the operation of irradiation, and cooling unit 4 is arranged to reduce the temperature of the plates to below about 50° C. The cooling unit comprises a heat exchanger 24 fed with cold mains water through inlet pipe 26 and with ambient air forced through by impeller 28. Cooled air thus impinges on the plates as they pass through the cooler, exemplified by plate 12, and escapes into the irradiating unit 6.

Beyond the cooling unit in the direction of movement of the plates is a shallow bath 34 about 600 mm long and of width similar to that of the oven. Water is fed into the bath from the heat exchanger by means of a tube 36 whilst excess water runs over a weir 58, of which the upper edge, determining the water level 42, is just below the chains 22, and is removed through outlet pipe 38.

The chains, passing over a polypropylene guide 60 at the entrance to the bath, are deflected sharply downwardly into the water by means of non-rotating transverse bar 40 from which they then incline gradually upwardly to pass out of the bath over a second polypropylene guide 62. Whilst the trailing edges of the plates, which are substantially rigid, are supported by the portion of the chains leading to the guide 60, the leading edges project forwardly over the surface of the water in the bath until they come in contact with a rotary brush roller 44, located above and forwardly of the downwardly inclined portion of the chains, which presses on the leading edges of those plates, such as plate 14 shown, and guides them to enter the water and re-engage with the chains as they rise towards the guide 62.

A housing 46 is arranged over the bath and encloses a single high-powered (5 kw) UV lamp 48 arranged transversely of the direction of movement of the plates. The housing 46 is ventilated by air from the cooling unit which is then vented to atmosphere, by the aid of extractor fan 50. This also removes any ozone produced by lamp 48 which is a potential health hazard.

While the plates are located of the order of 30 mm below the level of the water in the bath, as plate 16 shown, they are irradiated with ultraviolet light from lamp 48 through a glass screen 64. The irradiation through the water is found to be more efficacious in the short time they are passing through the irradiation unit, than would be the case if the sensitive face of the plates were in contact with dry air.

Water draining from the chains 22 and a plate, such as plate 18 shown, on emergence from the bath over guide 62, is collected in drip tray 30, whilst a further drip tray 66 collects water which drains from the chains as they turn about the sprocket 54. Thereafter, the plate is developed in a developer.

Figure 2:
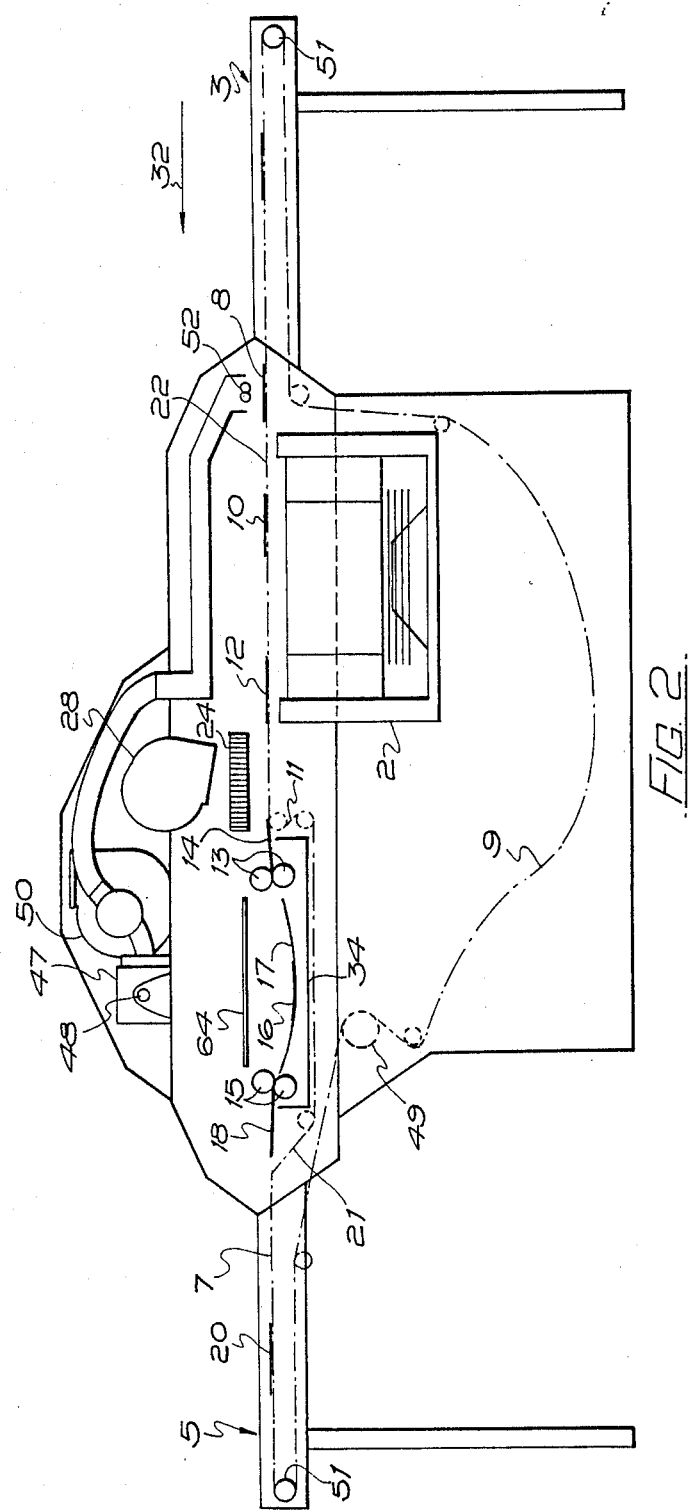
FIG. 2 shows a further embodiment in similar section.

FIG. 2 shows a plate processing machine of a further embodiment, which may be of alternative width according to the size of plates to be processed.

In this embodiment, features which have counterpart in the FIG. 1 embodiment will generally be referred to by a similar reference and thus the processing machine comprises an oven 2 about 600 mm length located beneath the upper reach of a plurality of endless chains 22 upon which plates 8 to 20 are passed from an input station 3 to an output station 5. The chains are drawn through the machine by sprockets 49 below bath 34 and restrained by flanged pulleys 51 at both ends of the machine whereby the upper reach 7 is taut and the lower reach 9 is slack.

Downstream of the oven the plates such as plate 12 pass into a cooling zone wherein a fan 28 drives air onto the plates via a heat exchanger 24 which is fed with cold mains water.

On leaving the cooling zone, the chains 22 are deflected along a downward path 11, whereby the leading edge of successive plates, exemplified by plate 14, project over a rectangular plate bath 34.

The bath 34, which is of width and length similar to that of the oven is supplied with water from the heat exchanger 24, which is maintained at a constant level by conventional means not shown.

A pair of transverse feed rollers 13 is arranged at the upstream end of the water bath 34 with the nip between them slightly below the water level, whilst a further pair of rollers 15 is arranged at the downstream end of the bath with its nip just out of the water. A perforated bed 17 of polypropylene is arranged within the bath extending transversely and, with a slight concave curvature lengthwise thereof between the roller pairs 13 and 15.

The rollers 13 are rotated so that their contiguous surfaces move forwardly at the same rate as the chains 22 so that they receive the leading edge of successive plates and introduce them into the water in the bath as the chains 22 are diverted downwardly without causing the trailing edge to slide over the chains. The upper roller of the pair 13 is positioned slightly forwardly of the other in the direction of movement of the plates so that as the plates emerge forwardly of the roller pair, and because by nature they are somewhat flexible, the plates are pushed at a slight downward angle into the water until they make contact wth the bed 17. Still gripped by the roller pair 13 each successive plate is then guided by the bed 17 and eventually directed upwardly and ultimately out of the water to be received in the nip between the rollers 15 of which the upper one is slightly rearward of the lower.

The distance between the roller pairs 13 and 15 is such that the shortest plate intended to be processed on the machine will be gripped by roller pair 15 at its leading edge before the trailing edge leaves the nip of the roller pair 13. The rollers of the pair 15 are synchronised with the rollers 13 so that there is no slip between the plate and either pair of rollers in the event that a longer plate is held for a short time in both nips. The nip between the rollers 15 being above the level of water in the bath, the rollers exert a squeegee effect on the plates as they withdraw them from the bath.

The upper reach 7 of the array of chains 22, having been diverted downwardly over portion 11, is guided under the water bath 34 and inclined upwardly forwardly of the bath, over portion 21 so as to be in a position to receive the plates emerging from the nip of the rollers 15 and convey them forwardly, as shown at 18, towards the output station 5.

A UV lamp 48 is arranged transversely of the machine over the water bath 34, and a horizontal glass screen 64 is arranged between the lamp 48 and the bath 34. As described in connection with the first embodiment, a plate such as plate 16 shown is arranged to be irradiated overall by means of the lamp 48 while it is being passed under the water in the bath 34 whereby any portions of the coating of the plate not exposed to actinic radiation prior to heating in the oven 2 are now rendered alkali soluble by the action of radiation from the lamp 48.

The lamp 48 is enclosed within a housing 47 which is connected to an extractor fan 50 by which any ozone formed around the lamp 48 is withdrawn and vented to atmosphere. The extractor fan also serves to draw air from the vicinity of an infrared pre-heating element 52, located upstream of oven 2, and vent this to atmosphere.

While it is preferred that the water-rich environment surrounding the plates while they receive the irradiation is provided with a continuous layer of liquid water, it is within the scope of the invention to replace the water bath by a chamber in which a humidity greater than that of the surrounding atmosphere is established and maintained by means of an atomising spray or other suitable and conventional means.

We claim:

1. A method for the reversal of photosoluble lithographic printing plates having a light sensitive coating at one surface, comprising the successive steps of:

(i) imagewise exposing a portion of the coated surface to render said portion soluble in developer;

(ii) heating the plate to render the imagewise exposed portion relatively insoluble in the developer;

(iii) overall irradiating the coated surface to solubilize the remaining portion of the coated surface not previously exposed, after said heating step; and (iv) promoting easier solubilization of the remaining portion of the coated surface during said step of overall irradiating by:

(A) applying water over the coated surface; and (B) applying the overall irradiation of step (iii) through the applied water.

2. A method according to claim 1 comprising the further step of cooling the plate between the heating thereof and the application of the water.

3. A method according to claim 1 wherein the water forms a continuous layer over said coated surface.

4. A method according to claim 1 wherein the light-sensitive coating compises an aromatic quinone diazide.

5. A method according to claim 4 wherein the light sensitive coating further comprises one of a resol and a Novolak resin.

* * * * *